US008630090B2

(12) United States Patent
Sohn et al.

(10) Patent No.: US 8,630,090 B2
(45) Date of Patent: Jan. 14, 2014

(54) HEAT DISSIPATION DEVICE FOR POWER CONVERSION MODULE

(75) Inventors: Young Ho Sohn, Gyunggi-do (KR); Kyu Bum Han, Gyunggi-do (KR); Young Jin Cho, Gyunggi-do (KR); Seog Moon Choi, Seoul (KR)

(73) Assignee: Samsung Electro-Mechanics Co., Ltd, Gyunggi-Do (KR)

( * ) Notice: Subject to any disclaimer, the term of this patent is extended or adjusted under 35 U.S.C. 154(b) by 34 days.

(21) Appl. No.: 13/037,803

(22) Filed: Mar. 1, 2011

(65) Prior Publication Data
US 2012/0103589 A1 May 3, 2012

(30) Foreign Application Priority Data
Oct. 28, 2010 (KR) .................. 10-2010-0106231

(51) Int. Cl.
*H05K 7/20* (2006.01)
*H05K 5/00* (2006.01)
*G06F 1/20* (2006.01)

(52) U.S. Cl.
USPC ..................................... 361/704; 361/679.46

(58) Field of Classification Search
None
See application file for complete search history.

(56) References Cited

U.S. PATENT DOCUMENTS

| 5,566,749 | A | * | 10/1996 | Jordan et al. | ................. | 165/80.3 |
| 5,940,288 | A | * | 8/1999 | Kociecki | ....................... | 363/144 |
| 5,945,746 | A | * | 8/1999 | Tracewell et al. | ............. | 307/43 |
| 6,109,340 | A | * | 8/2000 | Nakase et al. | ............... | 165/80.3 |
| 6,665,183 | B1 | * | 12/2003 | Shikata et al. | ................ | 361/697 |
| 6,801,431 | B2 | * | 10/2004 | Hartke et al. | ................. | 361/704 |
| 6,839,234 | B2 | * | 1/2005 | Niwatsukino et al. | ........ | 361/695 |
| 7,165,604 | B2 | * | 1/2007 | Huang | ......................... | 165/121 |
| 7,177,153 | B2 | * | 2/2007 | Radosevich et al. | .......... | 361/699 |
| 7,215,542 | B2 | * | 5/2007 | Chen et al. | .................... | 361/694 |
| 7,265,985 | B2 | * | 9/2007 | Widmayer et al. | ............ | 361/721 |
| 7,365,972 | B2 | * | 4/2008 | Chen et al. | ............... | 361/679.41 |

(Continued)

FOREIGN PATENT DOCUMENTS

| JP | 2003-259657 A | 9/2003 |
| JP | 2003-259658 A | 9/2003 |
| JP | 2010-167871 A | 8/2010 |
| WO | 2007/142023 | 12/2007 |

OTHER PUBLICATIONS

Office Action dated Jan. 8, 2013 for related Japanese Patent Application No. 2011-055065 and its English summary provided by the clients.

*Primary Examiner* — Jinhee Lee
*Assistant Examiner* — Xanthia C Cunningham
(74) *Attorney, Agent, or Firm* — Ladas & Parry, LLP

(57) ABSTRACT

Disclosed herein is a heat dissipation device for a power conversion module. The device includes a casing, a high-heat-dissipation heat sink and a circuit board. The casing includes a heat-dissipation fin unit which has heat dissipation fins arranged at positions spaced apart from each other by predetermined intervals. The casing has a mounting space therein. The high-heat-dissipation heat sink is installed in the mounting space of the casing. The circuit board is coupled to a lower surface of the casing. Therefore, the weight and size of the heat dissipation device can be reduced. In addition, the heat sink and the casing having the heat dissipation fins dissipate heat at the same time, thus enhancing the heat dissipation efficiency. Moreover, in an optimal design, the high-heat-dissipation heat sink is located at a position corresponding to a part which generates high heat so that the heat dissipation efficiency can be maximized.

3 Claims, 3 Drawing Sheets

(56) References Cited

U.S. PATENT DOCUMENTS

| | | | |
|---|---|---|---|
| 7,447,017 B2 * | 11/2008 | Koo | 361/688 |
| 7,537,048 B2 * | 5/2009 | Liu et al. | 165/104.33 |
| 7,613,001 B1 * | 11/2009 | Liu et al. | 361/700 |
| 7,800,901 B2 * | 9/2010 | Borowy et al. | 361/690 |
| 7,813,128 B2 * | 10/2010 | Marchand | 361/694 |
| 8,159,820 B2 * | 4/2012 | Ibori et al. | 361/695 |
| 2002/0125029 A1 * | 9/2002 | Hussaini | 174/50 |
| 2004/0012926 A1 * | 1/2004 | Wanes et al. | 361/715 |
| 2005/0029241 A1 * | 2/2005 | Miao Spear | 219/130.1 |
| 2005/0217824 A1 * | 10/2005 | Sandberg et al. | 165/80.3 |
| 2007/0034353 A1 * | 2/2007 | Liu et al. | 165/80.4 |
| 2007/0062673 A1 * | 3/2007 | Olesen | 165/80.4 |
| 2007/0261837 A1 * | 11/2007 | Valensa et al. | 165/185 |
| 2007/0279870 A1 * | 12/2007 | Sato et al. | 361/704 |
| 2009/0279251 A1 * | 11/2009 | Liu et al. | 361/690 |

\* cited by examiner

HEAT DISSIPATION DEVICE FOR POWER CONVERSION MODULE

CROSS REFERENCE TO RELATED APPLICATION

This application claims the benefit of Korean Patent Application No. 10-2010-0106231, filed Oct. 28, 2010, entitled "Thermal device for power converting module", which is hereby incorporated by reference in its entirety into this application.

BACKGROUND OF THE INVENTION

1. Technical Field

The present invention relates to a heat dissipation device for a power conversion module.

2. Description of the Related Art

Generally, heat dissipation devices for power conversion modules influence the reliability of the performance of the power conversion modules. Therefore, thermal design is one of the important factors in the design of a power conversion module. Furthermore, to enhance heat dissipation efficiency, circuit structures for minimizing power loss, structures which mount heat generating devices to circuit boards, the structures and materials of heat dissipation fins and casings, conductive substances that are thermally different such as thermal grease, bonding material for parts, molding material, etc. must be considered. Heat dissipation performance of the power conversion modules can be enhanced by optimizing these considerations.

In detail, in power conversion modules according to conventional techniques, forced air-cooling methods or water-cooling methods are used which take into account the heat generation rates of devices of the modules. The forced air-cooling methods are less expensive than the water-cooling methods, but the forced air-cooling methods are disadvantageous in that the heat transfer efficiency is comparatively low. For example, an on-board charger having an output capacity of 3.3 KW may use both a forced air-cooling method and a water-cooling method.

Furthermore, in the case of the forced air-cooling methods, there is a casing of, for example, a charger, that is typically used as a heat dissipation means instead of using only a heat sink to cool a high heat generating device. Such heat dissipation devices have a separate fan which supplies external air to the casing for heat dissipation so that the entire system can be satisfactorily cooled. Moreover, the heat dissipation devices are coupled to a circuit board such that heat generating devices are as close as possible to the heat dissipation casing to reduce heat resistance.

As another example, DC-DC converters also resort to the existing cooling method in which a fan directly supplies air to fins of a casing of a heat sink to which a device are mounted so as to reduce a thermal pinch phenomenon of the device. Below a representative example of a heat dissipation device for a power conversion module according to a conventional technique will be described in detail.

FIG. 1 is a perspective view showing the heat dissipation device for the power conversion module according to the conventional technique. As shown in FIG. 1, the heat dissipation device 100 has a casing 110 and heat dissipation fins 120 which are provided on the entire area of the casing 110. The heat dissipation fins 120 for forming a heat sink are formed by die-casting at positions spaced apart from each other at predetermined intervals. Due to the heat dissipation fins 120 and a base of the heat sink, the heat dissipation device is comparatively heavy. Furthermore, in the circuit structure of the power conversion module, the position of a heat generating device cannot change because of input and output power paths, so that it is very difficult to realize effective heat dissipation performance. Moreover, if the size of the heat dissipation fin or the thickness of the base is increased to enhance the heat dissipation performance, the size and weight of the module are increased further.

SUMMARY OF THE INVENTION

The present invention has been made in an effort to provide a heat dissipation device for a power conversion module which includes a casing on which heat dissipation fins are partially provided and a high-heat-dissipation heat sink is mounted, unlike the conventional heat dissipation device, so that the weight and size of the heat dissipation device can be reduced, and the heat sink and the casing having the heat dissipation fins dissipate heat at the same time, thus enhancing the heat dissipation efficiency, and in an optimal design of which when the high-heat-dissipation heat sink is located at a position corresponding to a high heat generating part, the heat dissipation efficiency can be further enhanced.

In a heat dissipation device for a power conversion module according to an embodiment of the present invention, a casing includes a heat-dissipation fin unit. The heat-dissipation fin unit has a plurality of heat dissipation fins which are arranged at positions spaced apart from each other by predetermined intervals. The casing has a mounting space therein. A high-heat-dissipation heat sink is installed in the mounting space of the casing. A circuit board is coupled to a lower surface of the casing.

The high-heat-dissipation heat sink may be made of aluminum or copper.

The mounting space of the casing may be formed at a position corresponding to a high heat generating part of the circuit board.

The casing and the circuit board may have fastening holes formed at positions corresponding to each other. The heat dissipation device may further include fasteners tightened into the corresponding fastening holes to couple the circuit board to the casing.

Furthermore, a power conversion device may be mounted to the circuit board.

In the heat dissipation device according to the present invention, heat dissipation fins are partially provided on a casing, and a high-heat-dissipation heat sink is mounted to the casing. Therefore, the weight and size of the heat dissipation device can be reduced. In addition, the heat sink and the casing having the heat dissipation fins dissipate heat at the same time, thus enhancing the efficiency of heat dissipation. Moreover, in an optimal design, the high-heat-dissipation heat sink is located at a position corresponding to a part which generates high heat so that the heat dissipation efficiency can be maximized.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
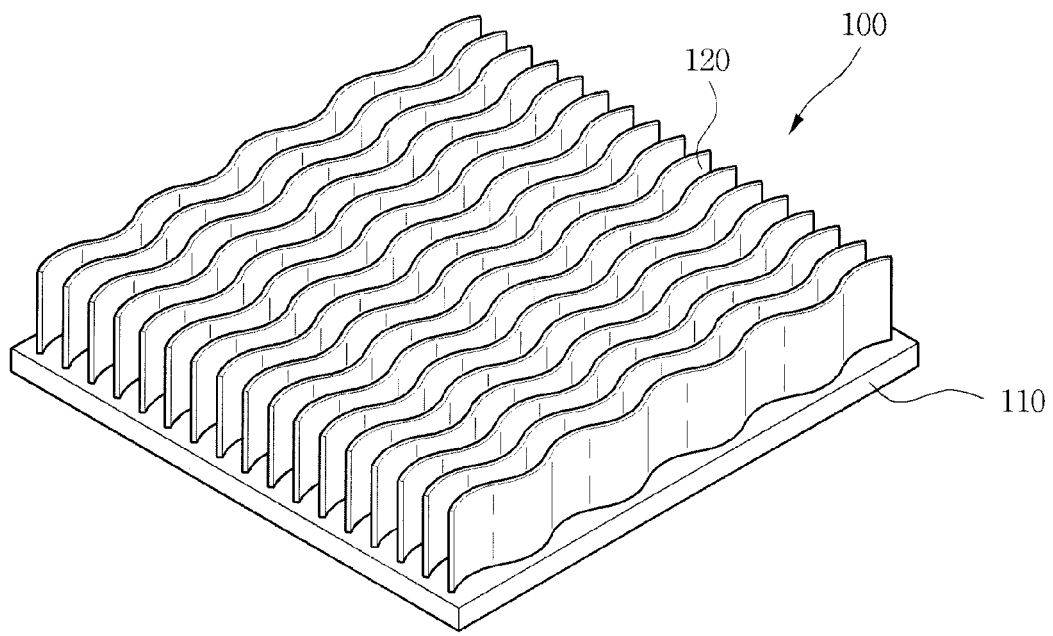
FIG. 1 is a perspective view showing a heat dissipation device for a power conversion module, according to a conventional technique.

Reference now should be made to the drawings, in which the same reference numerals are used throughout the different drawings to designate the same or similar components. In the following description, when it is determined that the detailed description of the conventional function and conventional structure would confuse the gist of the present invention, such a description may be omitted. Furthermore, the terms and words used in the specification and claims are not necessarily limited to typical or dictionary meanings, but must be understood as indicating concepts selected by the inventor to best illustrate the present invention, and must be interpreted as having had their meanings and concepts adapted to the scope and sprit of the present invention so that the technology of the present invention could be better understood.

Hereinafter, an embodiment of the present invention will be described in detail with reference to the attached drawings.

Figure 2:
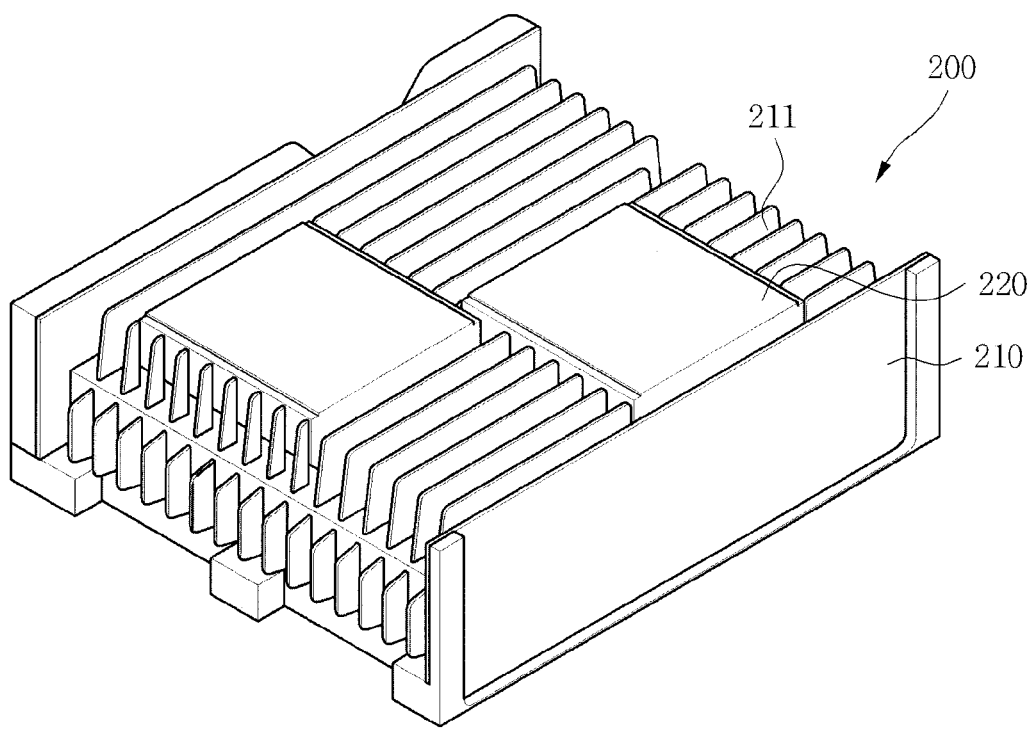
FIG. 2 is a perspective view showing a heat dissipation device for a power conversion module, according to an embodiment of the present invention.
Figure 3:
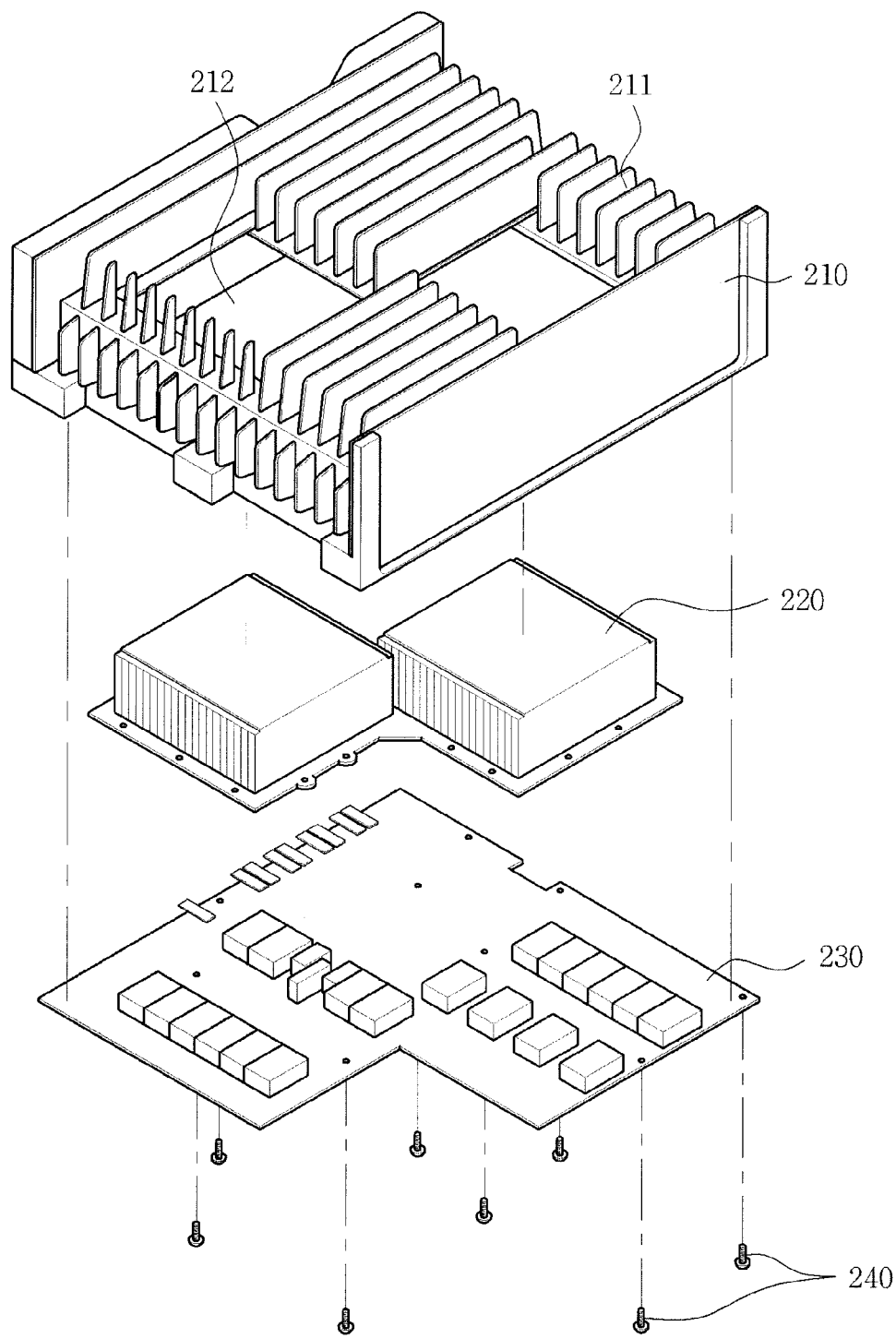
FIG. 3 is an exploded perspective view of the heat dissipation device of FIG. 2.

FIG. 2 is a perspective view showing a heat dissipation device 200 for a power conversion module, according to the embodiment of the present invention. FIG. 3 is an exploded perspective view of the heat dissipation device 200 of FIG. 2. As shown in FIGS. 2 and 3, the heat dissipation device 200 includes a casing 210 of the power conversion module, a high-heat-dissipation heat sink 220, a circuit board 230 and fasteners 240.

The casing 210 has a heat-dissipation fin unit 211 which has a plurality of heat dissipation fins. The heat dissipation fins are arranged at positions spaced apart from each other by predetermined intervals. The casing 210 further has a mounting space 212 which is formed in the heat-dissipation fin unit 211.

The heat sink 220 has a higher heat dissipation efficiency than does a case where only heat dissipation fins are provided in the casing 210. The heat sink 220 is made of aluminum or copper and is installed in the mounting space 212 of the casing 210.

Furthermore, a power conversion device is mounted to the circuit board 230. The circuit board 230 is coupled to a lower surface of the casing 210. In the heat dissipation device 200 having the above-mentioned construction, heat generated from the circuit board 230 is dissipated by the heat sink 220 and the casing 210 having the heat dissipation fins, thereby cooling the circuit board 230. To enhance the efficiency of the heat dissipation device of the power conversion module, the mounting space 212 of the casing 210 is formed at a position corresponding to a high heat generating part of the circuit board where more heat is generated than at other parts, and the heat sink 220 is installed in the mounting space 212. Then, heat generated from the circuit board 230 can be more efficiently dissipated.

Fastening holes (not shown) are formed in the casing 210 and the circuit board 230 at positions corresponding to each other. The circuit board 230 is coupled to the casing 210 by tightening the fasteners 240 into the fastening holes.

As described above, a heat dissipation device for a power conversion module according to the present invention includes a casing on which heat dissipation fins are partially provided and a high-heat-dissipation heat sink is mounted, unlike the conventional heat dissipation device. Therefore, the weight and size of the heat dissipation device can be reduced. In addition, the heat sink and the casing having the heat dissipation fins dissipate heat at the same time, thus enhancing the heat dissipation efficiency. Moreover, in an optimal design, when the high-heat-dissipation heat sink is located at a position corresponding to a part which generates high heat, the heat dissipation efficiency can be maximized.

Although the embodiments of the present invention have been disclosed for illustrative purposes, it will be appreciated that the heat dissipation device for a power conversion module according to the invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A heat dissipation device for a power conversion module, comprising:
    a casing comprising a heat-dissipation fin unit having a plurality of heat dissipation fins arranged at positions spaced apart from each other by predetermined intervals, the casing having a mounting space therein;
    a high-heat-dissipation heat sink installed in the mounting space of the casing; and
    a circuit board coupled to a lower surface of the casing,
    wherein:
        a power conversion device is mounted to the circuit board,
        the heat-dissipation fin unit and the mounting space are arranged at the same surface of the casing,
        the mounting space of the casing is formed at a position corresponding to a high heat generating part of the circuit board where more heat is generated than at other parts, and
        the high-heat-dissipation heat sink is configured to dissipate heat generated from the high heat generating part of the circuit board.

2. The heat dissipation device as set forth in claim 1, wherein the high-heat-dissipation heat sink is made of aluminum or copper.

3. The heat dissipation device as set forth in claim 1, wherein the casing and the circuit board have fastening holes formed at positions corresponding to each other, the heat dissipation device further comprising: fasteners tightened into the corresponding fastening holes to couple the circuit board to the casing.

* * * * *